(12) United States Patent
Butler

(10) Patent No.: US 10,884,071 B2
(45) Date of Patent: Jan. 5, 2021

(54) ELECTRICAL SUPPLY SYSTEM

(71) Applicant: Elevare Energy IP Pty Ltd, Aspley (AU)

(72) Inventor: Dale John Butler, Yeronga (AU)

(73) Assignee: Elexsys IP Pty Ltd., Aspley (AU)

( * ) Notice: Subject to any disclaimer, the term of this patent is extended or adjusted under 35 U.S.C. 154(b) by 0 days.

(21) Appl. No.: 16/422,563

(22) Filed: May 24, 2019

(65) Prior Publication Data

US 2020/0059086 A1 Feb. 20, 2020

Related U.S. Application Data

(62) Division of application No. 15/038,456, filed as application No. PCT/AU2013/001350 on Nov. 22, 2013, now Pat. No. 10,338,121.

(30) Foreign Application Priority Data

Nov. 23, 2012 (AU) ................................ 2012905138

(51) Int. Cl.
*H02H 3/00* (2006.01)
*G01R 31/50* (2020.01)
(Continued)

(52) U.S. Cl.
CPC ............ *G01R 31/50* (2020.01); *G01R 31/40* (2013.01); *H02H 1/0007* (2013.01);
(Continued)

(58) Field of Classification Search
None
See application file for complete search history.

(56) References Cited

U.S. PATENT DOCUMENTS

| | | |
|---|---|---|
| 4,811,184 A | 3/1989 | Koninsky et al. |
| 6,198,611 B1 | 3/2001 | MacBeth |

(Continued)

FOREIGN PATENT DOCUMENTS

| | | |
|---|---|---|
| AU | 2011201247 B2 | 3/2010 |
| DE | 102005030907 A1 | 1/2007 |

(Continued)

OTHER PUBLICATIONS

ISA/AU, International Search Report and Written Opinion, Int'l Appln No. PCT/AU2013/001350, dated Jan. 21, 2014 (5 pages).

*Primary Examiner* — Stephen W Jackson
(74) *Attorney, Agent, or Firm* — Fish IP Law, LLP

(57) ABSTRACT

An electrical supply system including a voltage converter including having an input electrically coupled to a supply for receiving a supply signal and an output for supplying an output signal having a output voltage different to a supply voltage of the supply signal. The system includes a diode including a diode input electrically coupled to the voltage converter output, a bus electrically coupled to a diode output and at least one of a load and a store, a voltage sensor for detecting the output voltage, a current sensor for detecting a diode input current and an electronic processing device coupled to the sensors for monitoring the diode input current and the output voltage and detecting a fault in the electrical supply system based on at least the diode input current and output voltage.

11 Claims, 4 Drawing Sheets

(51) Int. Cl.
*G01R 31/40* (2020.01)
*H02S 50/10* (2014.01)
*H02H 1/00* (2006.01)
*H02H 3/38* (2006.01)
*H02H 7/20* (2006.01)
*G01R 19/12* (2006.01)
*G01R 19/165* (2006.01)

(52) U.S. Cl.
CPC ............ *H02H 1/0015* (2013.01); *H02H 3/38* (2013.01); *H02H 7/20* (2013.01); *H02S 50/10* (2014.12); *G01R 19/12* (2013.01); *G01R 19/165* (2013.01)

(56) References Cited

U.S. PATENT DOCUMENTS

| | | |
|---|---|---|
| 6,278,279 B1 | 8/2001 | Daun-Lindberg et al. |
| 6,504,692 B1 | 1/2003 | MacBeth et al. |
| 6,611,443 B2 * | 8/2003 | Gaudreau ............. H02M 1/088 363/125 |
| 6,788,034 B2 * | 9/2004 | Hillberg ................ H02H 9/002 323/205 |
| 2007/0188137 A1 | 8/2007 | Scheucher |
| 2008/0129307 A1 | 6/2008 | Yu et al. |
| 2009/0180226 A1 | 7/2009 | Rogoll et al. |
| 2011/0210611 A1 | 9/2011 | Ledenev et al. |
| 2012/0081934 A1 | 4/2012 | Garrity et al. |
| 2012/0174961 A1 | 7/2012 | Larson et al. |

FOREIGN PATENT DOCUMENTS

| | | |
|---|---|---|
| EP | 0428377 B1 | 3/1996 |
| EP | 2741388 B1 | 6/2014 |
| KR | 100703927 B1 | 3/2007 |
| WO | WO 2012/100263 A2 | 7/2012 |

* cited by examiner

ELECTRICAL SUPPLY SYSTEM

This application is a divisional of U.S. patent application Ser. No. 15/038,456, which is a National Stage entry of international patent application PCT/AU2013/001350, filed Nov. 22, 2013, which claims benefit of foreign priority to Australian patent application 2012905138, filed Nov. 23, 2012. These applications and all other extrinsic references contained herein are incorporated by reference in their entirety

BACKGROUND OF THE INVENTION

The present invention relates to an electrical supply system for use in an electrical supply, and in particular, to an electrical supply system including fault detection.

DESCRIPTION OF THE PRIOR ART

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

Electrical supply systems are known, and in particular supply systems which use DC-DC voltage converters exist. However, typically these systems suffer from a number of drawbacks, including the difficulty in detecting and isolating faults such as arc faults, or open circuit faults, or the like.

In one particular application, photovoltaic (PV) systems, the consequence of an arcing fault in a roof-mounted PV array presents a serious and potentially life threatening hazard. The risk of an arcing fault is mitigated by various methods of arc detection applied to the PV array and associated wiring.

However, one of the difficulties with these conventional circuit breakers in PV systems is that the PV cell is not a voltage source; it is a very weak current source. Under these conditions it is difficult for typical magnetic arc detection to distinguish a fault current from normal load currents. This means that magnetic arc blow out techniques do not work effectively and that other techniques need be used to extinguish the arc. DC breakers are also polarity sensitive and may catch fire if connected in the reverse polarity or if there is a reverse power fault where the polarity of the dc current is reversed by an arcing fault.

SUMMARY OF THE PRESENT INVENTION

The present invention seeks to ameliorate one or more of the problems associated with the prior art.

In a first broad form the present invention seeks to provide an electrical supply system including:
  a) a voltage converter including:
     i) a voltage converter input electrically coupled to a supply for receiving a supply signal; and,
     ii) a voltage converter output for supplying an output signal, the output signal having a output voltage different to a supply voltage of the supply signal;
  b) a diode including a diode input electrically coupled to the voltage converter output;
  c) a bus electrically coupled to a diode output and at least one of a load and a store;
  d) a voltage sensor for detecting the output voltage;
  e) a current sensor for detecting a diode input current; and
  f) an electronic processing device coupled to the sensors for:
     i) monitoring the diode input current and the output voltage; and,
     ii) detecting a fault in the electrical supply system based on at least the diode input current and output voltage.

Typically the electronic processing device is for isolating the supply from the bus in response to detection of a fault.

Typically the electronic processing device is for isolating the supply from the bus by deactivating the voltage converter.

Typically the electronic processing device is for:
  a) causing the output voltage to be lower than a bus voltage;
  b) monitoring the diode input current; and,
  c) detecting a fault depending on the diode input current.

Typically the electronic processing device is for:
  a) causing the output voltage to be lower than a bus voltage;
  b) causing the output voltage to increase over a predefined time until the output voltage is greater than the bus voltage;
  c) monitoring changes in the diode input current; and,
  d) detecting a fault depending on the change in diode input current.

Typically the electronic processing device is for:
  a) causing the output voltage to be higher than a bus voltage;
  b) monitoring the diode input current; and,
  c) detecting a fault depending on the diode input current.

Typically the voltage converter is a DC/DC converter.

Typically the voltage converter includes:
  a) a plurality of switches;
  b) a transformer; and
  c) a controller for controlling the switches to thereby selectively apply the supply signal to a transformer input to thereby generate the output signal at a transformer output.

Typically the switches include transistors.

Typically the controller causes the switches to toggle to thereby periodically reverse the polarity of the supply signal applied to the transformer input.

Typically the switches are metal oxide semiconductor field effect transistors.

Typically the voltage converter includes a rectifier for coupling the transformer to the voltage converter output.

Typically the electronic processing device is at least one of:
  a) coupled to the controller; and,
  b) is the controller.

Typically the electronic processing device:
  a) determines a bus voltage; and,
  b) detects a fault in the electrical supply system based on the bus voltage.

Typically the electronic processing device derives a bus voltage from the output voltage.

Typically system includes a second voltage sensor for sensing a bus voltage.

In a second broad form the present invention seeks to provide a method of electrical supply, the method including, in an electronic processing device:

a) monitoring a diode input current, an output voltage and a bus voltage of an electrical supply system, the electrical supply system including:
   i) a voltage converter including:
      a voltage converter input electrically coupled to a supply for receiving a supply signal; and,
      a voltage converter output for supplying an output signal, the output signal having the output voltage different to a supply voltage of the supply signal;
   ii) a diode including a diode input electrically coupled to the voltage converter output;
   iii) a bus electrically coupled to a diode output and at least one of a load and a store;
   iv) a first voltage sensor for detecting the output voltage;
   v) a current sensor for detecting the diode input current; and,
b) detecting a fault in the electrical supply system based on the diode input current, and depending on the output and bus voltages.

Typically the method includes, in the electronic processing device:
a) causing the output voltage to be lower than the bus voltage;
b) monitoring the diode input current; and,
c) detecting a fault depending on the diode input current.

Typically the method includes, in the electronic processing device:
a) causing the output voltage to be lower than the bus voltage;
b) causing the output voltage to increase over a predefined time until the output voltage is greater than the bus voltage;
c) monitoring changes in the diode input current; and,
d) detecting a fault depending on the change in diode input current.

Typically the method includes, in the electronic processing device:
a) causing the output voltage to be higher than the bus voltage;
b) monitoring the diode input current; and,
c) detecting a fault depending on the diode input current.

In a third broad form the present invention seeks to provide an electrical isolator for isolating a power supply, the isolator including a voltage converter having:
a) a voltage converter input electrically coupled to a supply for receiving a supply signal; and,
b) a voltage converter output for supplying an output signal, the output signal having a output voltage different to a supply voltage of the supply signal;
c) a transformer;
d) a switching circuit coupled to the voltage converter input and the transformer; and
e) a controller that controls the switching circuit to thereby selectively apply the supply signal to a transformer input to thereby at least one of:
   i) generate the output signal; and,
   ii) electrically isolate the voltage converter input from the voltage converter output.

Typically the switching circuit includes a plurality of switches.

Typically the switches include transistors.

Typically the controller causes the switches to toggle to thereby periodically reverse the polarity of the supply signal applied to the transformer input.

Typically the switches are metal oxide semiconductor field effect transistors.

Typically the voltage converter includes a rectifier for coupling the transformer to the voltage converter output.

Typically the voltage converter includes galvanic isolation in which functional sections of the voltage converter are electrically isolated.

In a fourth broad form the present invention seeks to provide an electrical supply system including a DC bus connected to the output of a voltage converter by an output diode and a controller, wherein in use the controller at least one of:
a) attempting to detect a shunt arc by:
   i) reducing the voltage converter output voltage to a preset voltage below the DC bus voltage;
   ii) measuring current flow; and,
   iii) detecting a shunt arc if current flows; and,
b) attempting to detect a series arc by:
   i) attempting to increase the output voltage of the voltage converter to a preset voltage above the DC bus voltage;
   ii) measuring the change of the voltage;
   iii) detecting a series arc if the voltage rises above the DC bus voltage and a threshold amount.

Typically the controller shuts down the voltage converter if a shunt or series arc fault is detected.

In a fifth broad form the present invention seeks to provide a method of detecting a fault in an electrical supply system including a DC bus connected to the output of a voltage converter by an output diode, the method including at least one of:
a) attempting to detect a shunt arc by:
   i) reducing the voltage converter output voltage to a preset voltage below the DC bus voltage;
   ii) measuring current flow; and,
   iii) detecting a shunt arc if current flows; and,
b) attempting to detect a series arc by:
   i) attempting to increase the output voltage of the voltage converter to a preset voltage above the DC bus voltage;
   ii) measuring the change of the voltage;
   iii) detecting a series arc if the voltage rises above the DC bus voltage and a threshold amount.

It will be appreciated that the above described broad forms of the invention and there respective features can be used independently or in conjunction.

BRIEF DESCRIPTION OF THE DRAWINGS

An example of the present invention will now be described with reference to the accompanying drawings, in which.

DETAILED DESCRIPTION OF THE PREFERRED EMBODIMENTS

Figure 1:
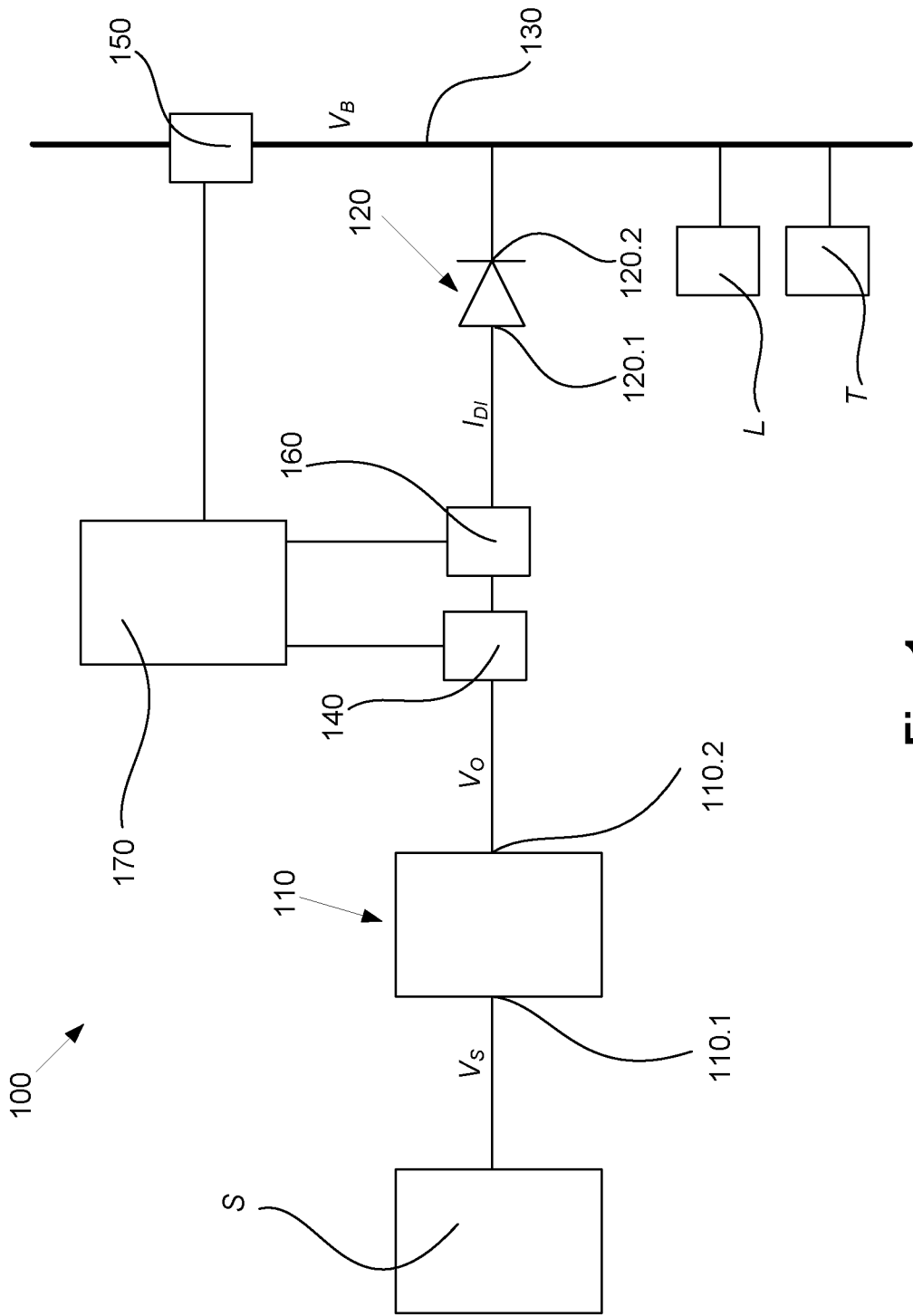
FIG. 1 is a schematic diagram of a first example of an electrical supply system.

An example of an electrical supply system 100 will now be described with reference to FIG. 1.

In this example, the electrical supply system 100 includes a voltage converter 110 including a voltage converter input 110.1 electrically coupled to a supply S for receiving a supply signal, and a voltage converter output 110.2 for supplying an output signal, the output signal having a output voltage $V_O$ different to a supply voltage $V_S$ of the supply signal.

The electrical supply system 100 also includes a diode 120 including a diode input 120.1 electrically coupled to the voltage converter output 110.2, and a bus 130 electrically coupled to a diode output 120.2 and one or more of a load L and a store T. In this example, both the load L and the store T are shown, however this is not essential and either or both of the load L and the store T may be electrically coupled to the bus 130.

The electrical supply system 100 further includes a voltage sensor 140 for detecting the output voltage $V_O$, and a current sensor 160 for detecting a diode input current $I_{DI}$. An optional second voltage sensor 150 can be provided for detecting a bus voltage $V_B$, although alternatively the bus voltage $V_B$ could be from the output voltage $V_O$, for example based on the voltage drop that would occur across the diode 120. An electronic processing device 170 is coupled to the voltage sensor 140 and current sensor 160 and optionally a second voltage sensor 150, if this is included. This allows the electronic process device 170 to monitor the diode input current and the output voltage $V_O$, as well as derive or monitor the bus voltage $V_B$ and, detecting a fault in the electrical supply system based on the diode input current $I_{DI}$, and depending on the output and bus voltages $V_O$, $V_B$.

According to the above described arrangement, the electrical supply system 100 includes an electronic processing device 170 for monitoring current and voltages, $I_{DI}$, $V_O$, $V_B$, and detecting one or more faults in the electrical supply system 100. In particular, this arrangement provides for increased safety over previous systems, as faults such as arcing faults, component faults, open or short circuit faults, and the like, can be detected, and optionally isolated, thus preventing serious injury or death to people or serious faults or breakage to any peripheral equipment.

In addition, the electrical supply system 100 in this example enables faults to be detected when the supply S includes a weak current source. This is particularly useful in PV systems where a fault can represent a serious and potentially life threatening hazard. However, this particular application is not essential, and the electrical supply system 100 may be used with any type of supply S, capable of supplying a DC signal.

Furthermore, the voltage converter 110 can act to provide electrical isolation of the supply S from the bus 130, and hence the load L or battery T. In this regard, and as will be explained in more detail below, in one example the voltage converter 110 includes a switching circuit coupled to a transformer, with the switching circuit operating to selectively apply the DC supply current to the transformer, to thereby generate the output signal. In this instance, by deactivating the switching, so that either no current, or only a DC current is applied to the transformer, this will ensure that no output signal is generated, thereby isolating supply S from the bus 130. This therefore provides a straightforward and reliable mechanism to provide isolation in the event that a fault occurs.

A number of further features will now be described.

In one example, the electronic processing device 170 may include any suitable device, including a processing system. Accordingly, the processing system can include any suitable form of electronic processing system or device that is capable of receiving and interpreting signals from the voltage and/or current sensors 140, 150, 160.

In one example, the processing system includes a processor, a memory, an input/output (I/O) device, such as a keyboard and display, and an external interface coupled together via a processing system bus. It will be appreciated that the I/O device may further include an input, such as a keyboard, keypad, touch screen, button, switch, or the like which thereby allowing a user to input data, however this is not essential. The external interface is used for coupling the processing system to peripheral devices, such the first voltage, second voltage and current sensors 140, 150, 160, as well as to devices, such as communications networks, databases, other storage devices, or the like. In addition, the external interface may be coupled to the voltage converter 110, supply S, or the like, however this is not essential, and in any event will be discussed in further detail below. It will also be appreciated that additional hardware components, may be incorporated into the processing system, depending on the particular implementation.

In use, the processor executes instructions in the form of applications software stored in the memory to allow signals from the sensors 140, 150, 160 to be interpreted and used, for in detecting a fault. Accordingly, for the purposes of the following description, it will be appreciated that actions performed by the processing system are typically performed by the processor under control of instructions stored in the memory, and this will not therefore be described in further detail below.

Accordingly, it will be appreciated that the processing system may be formed from any suitably programmed processing system. Typically however, the electronic processing device would be in the form of a microprocessor, microchip processor, logic gate configuration, firmware optionally associated with implementing logic such as an FPGA (Field Programmable Gate Array), an EPROM (Erasable Programmable Read Only Memory), or any other electronic device, system or arrangement capable of interacting with the sensors 140, 150, 160.

The supply S in this example may include any suitable DC supply, for example a PV cell, a current supply, a voltage supply, a DC power supply, battery, generator, alternator, or the like. In addition, the voltage converter 110 may also include any suitable converter, including a DC-DC converter, or the like.

Furthermore, the voltage converter 110 may include isolation, for example, galvanic isolation in which functional sections of the voltage converter 110 are electrically isolated, and instead energy is exchanged using inductance, capacitance, or the like.

The diode 120 may include any suitable device or component in which current is substantially allowed to flow from the diode input 120.1 to the diode output 120.2, however is substantially prevented from flowing from the diode output 120.2 to the diode input 120.1, for example a semiconductor diode, vacuum tube diode, or the like.

In this example, the voltage sensor 140, the optional second voltage sensor 150, and current sensor 160 may include any suitable sensor. In this regard, the first voltage sensor and optional second voltage sensor 140, 150 may include similar or different respective sensors, including a voltmeter, multimeter, vacuum tube voltmeter (VTVM), field effect transistor voltmeter (FET-VM), or the like. The current sensor 160 may include a multimeter, ammeter, picoammeter, or the like.

The load L and/or store T may also include any suitable component(s), for example, the store T may include a battery for storing the power collected from the bus 130 for use at another time. Alternatively, the load L may include any number of various electronic and electrical devices, and can include an inverter for converting DC power to an AC supply, for example to replace mains electricity within a building or the like. However, this feature is not essential, and instead the electric supply system 100 may include any suitable load L and/or store T.

In one example, the electronic processing device 170 uses the voltage converter 110 for isolating the supply S from the bus 130 in response to detection of a fault. This may be achieved in any suitable manner, for example, by deactivating the voltage converter 110, creating an open circuit at the voltage converter input or output 110.1, 110.2, or diode input or output 120.1, 120.2, or the like. However this feature is not essential, and instead the electronic processing device 170 may provide an indication of the fault to a user or operator via a communications system, keyboard, or any suitably output, in order that the user may manually isolate the supply S, or take other appropriate action.

In addition, after isolation the electronic processing device 170 may take any appropriate action, for example, reactivating the voltage converter 110 after a predefined delay, or upon determination of a user input, or the like.

In order to detect the faults, the electronic processing device 170 is typically adapted to cause certain operating conditions to arise, then monitor the response of the system to those conditions and use this information to detect faults.

For example, the electronic processing device 170 can cause the output voltage $V_O$ to be lower than the bus voltage $V_B$, and then monitor the diode input current $I_{DI}$, and detecting a fault depending on the diode input current. In particular, when the output voltage $V_O$ is lower that the bus voltage $V_B$ the diode input current $I_{DI}$ should be substantially zero, or near zero. However, if the diode input current $I_{DI}$ is not substantially zero, this indicates a fault such as a short circuit or a shunt arcing fault has occurred, for example at a point after the voltage converter output 110.2.

The output voltage $V_O$ can be lowered below the bus voltage $V_B$, typically known as a Reduced Voltage Zero power state, in any suitable manner, such as causing the voltage converter to increase the output current $V_O$. In addition, the output voltage $V_O$ may remain lower than the bus voltage $V_B$ for any suitable amount of time, for example, typically between 1 ms and 100 ms, more typically 5 ms and 50 ms, and more typically 10 ms. In addition, the output voltage $V_O$ may be any suitable lower voltage relative to the bus voltage $V_B$, for example, typically 1% to 50% lower than the bus voltage $V_B$, more typically 10% to 30% lower, and more typically 20% lower.

Additionally or alternatively, the electronic processing device 170 can cause the output voltage $V_O$ to be lower than the bus voltage $V_B$, before causing the output voltage $V_O$ to increase over a predefined time until the output voltage $V_O$ is greater than the bus voltage $V_B$. During this process, the electronic processing device 170 monitors changes in the diode input current $I_{DI}$ and, detects a fault depending on the change in diode input current $I_{DI}$.

In this example, the diode input current $I_{DI}$ should increase at a rate substantially corresponding to the rate of change of the output signal $V_O$ after the output signal $V_O$ becomes higher than the bus voltage $V_B$. However, if this does not occur, this indicates that a series arc or other similar fault may be present, for example at a point after the voltage converter output 110.2.

Again the electronic processing device 170 may cause the output voltage $V_O$ to be lower than the bus voltage $V_B$ in any suitable manner, as described above, and in addition may cause the output voltage $V_O$ to increase over a predefined time in a similar manner, for example by causing the voltage converter to increase the output current $V_O$. In addition, the output voltage $V_O$ may be any suitable higher voltage relative to the bus voltage $V_B$ at the end of the predefined time, for example, typically 1% to 10% higher than the bus voltage $V_B$, more typically 2% to 7% higher, and more typically 5% higher.

In a further example, the electronic processing device 170 causes the output voltage $V_O$ to be higher than the bus voltage $V_B$, monitors the diode input current $I_{DI}$ and detects a fault depending on the diode input current $I_{DI}$. In the event that the monitored diode input current $I_{DI}$ is substantially zero, this indicates a fault in the diode or an open circuit, for example at a particular location such as after the voltage converter output 110.2. As described above, the output voltage $V_O$ may be caused to be higher than the bus voltage $V_B$ in any suitable manner.

It will be appreciated that this therefore provides three different mechanisms for detecting different faults within the electrical supply system, and that typically these methods would be repeatedly performed in sequence at a given frequency to allow continuous monitoring of the system, and thereby ensure the system is isolated as rapidly as possible in the event that a fault occurs.

For example, the fault detection process can be performed in response to user input, or automatically or semi-automatically, for example periodically. In this regard, periodic fault detection may occur at any suitable period, and typically every 50 ms to 2 s, more typically 100 ms to 1500 ms, and more typically 200 ms to 1000 ms. However, this feature is not essential.

Figure 2:
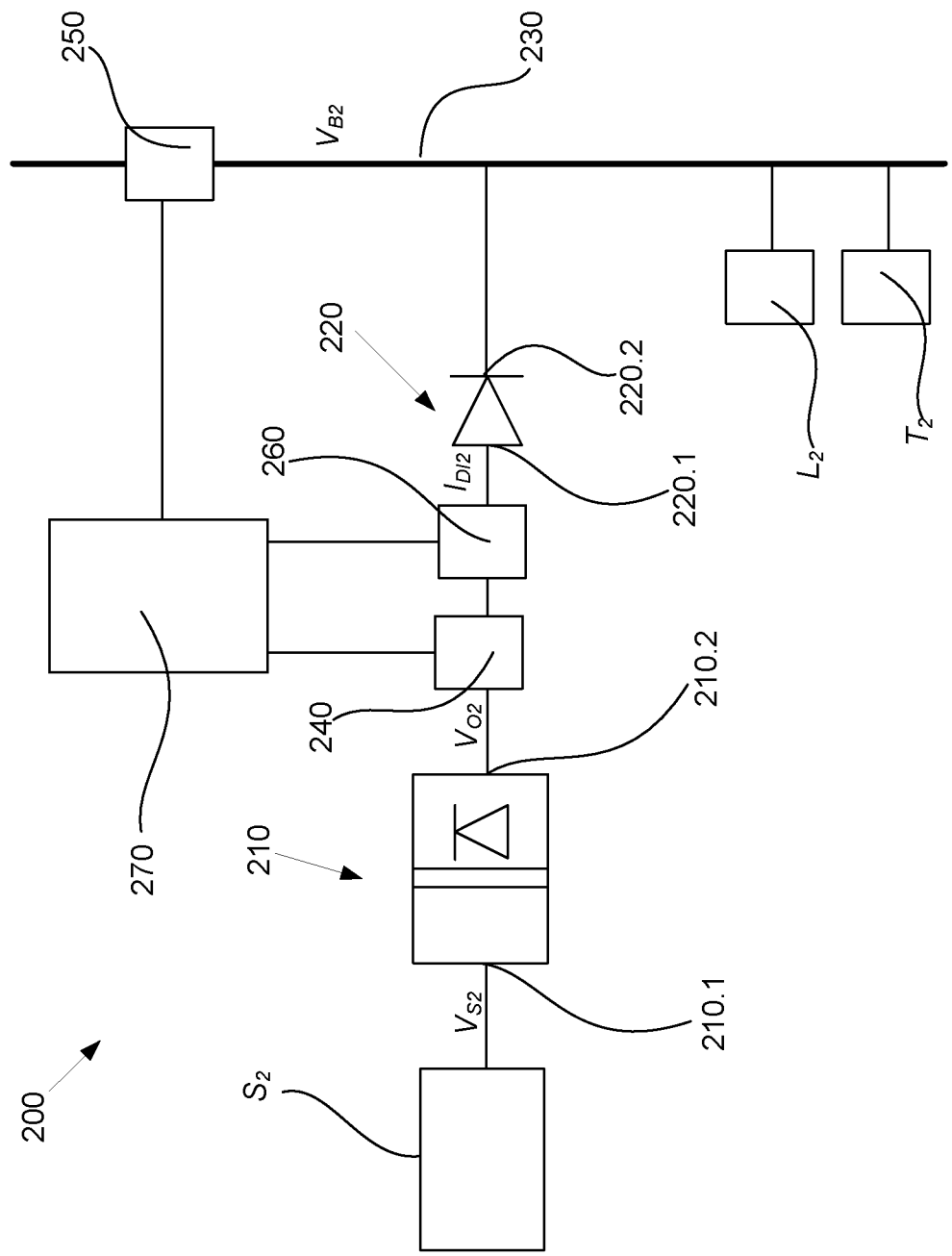
FIG. 2 is a schematic diagram of a second example of an electrical supply system.

A second example electrical supply system 200 is shown in FIG. 2. Features similar to those of the example described above have been assigned correspondingly similar reference numerals.

In this example, the electrical supply system 200 includes a voltage converter 210 including a voltage converter input 210.1 electrically coupled to a supply $S_2$, and a voltage converter output 210.2, a diode 220 including a diode input 220.1 electrically coupled to the voltage converter output 210.2, and a bus 230. The electrical supply system 200 further includes a first voltage sensor 240, a second voltage sensor 250, and a current sensor 260 for detecting a diode input current $I_{DI2}$. An electronic processing device 270 is coupled to the first voltage, second voltage and current sensors 240, 250, 260 for monitoring the diode input current $I_{DI2}$, output and bus voltages $V_{O2}$, $V_{B2}$ and, detecting a fault in the electrical supply system. It will therefore be appreciated that these features are largely similar to those described above with respect to FIG. 1, however further specific features will now be described.

In this example, the voltage converter 210 includes galvanic isolation, as discussed above. In addition, the voltage converter 210 includes a rectifier prior to the voltage converter output 210.2, and this will be discussed in more detail below.

Figure 3:
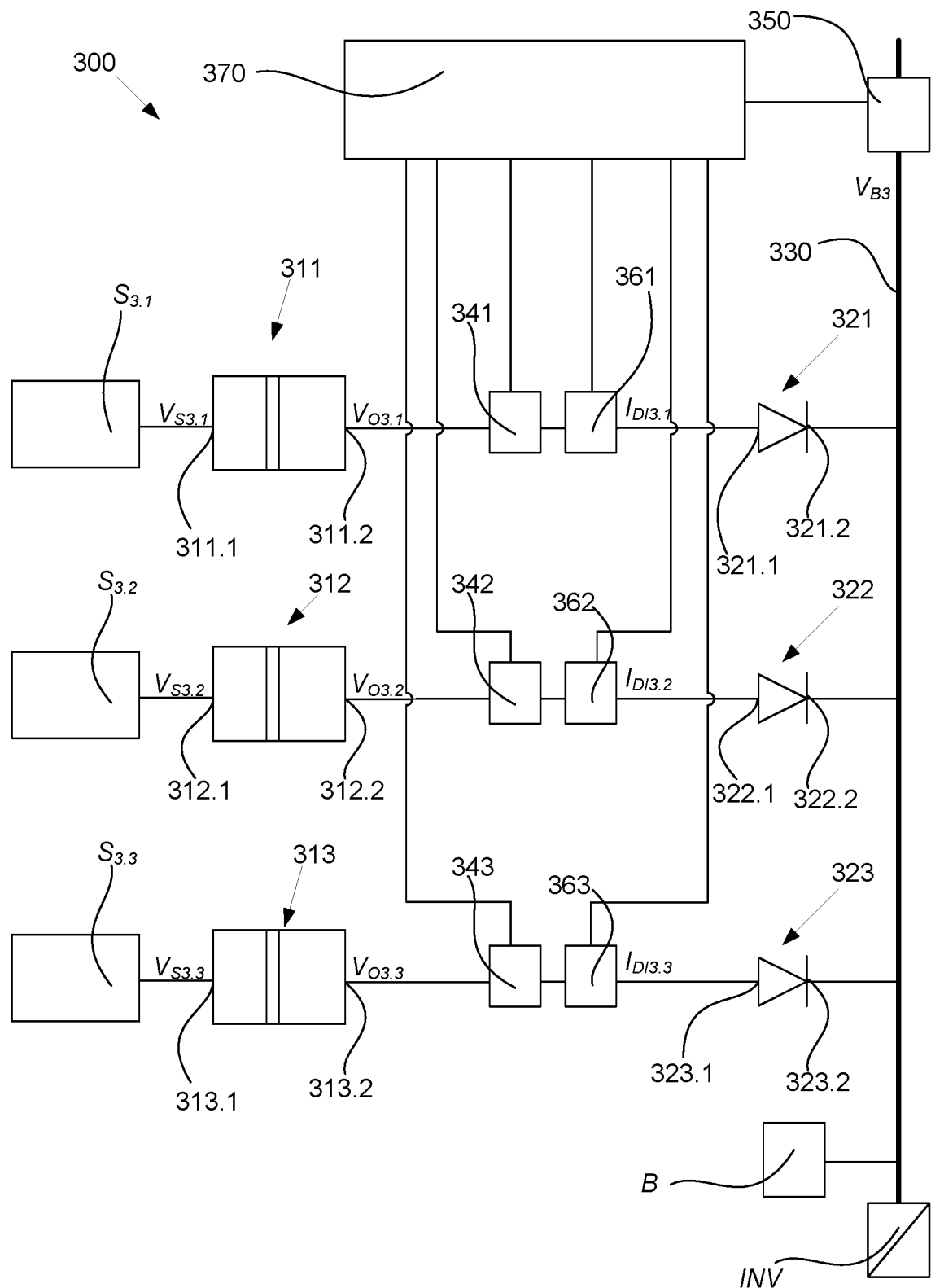
FIG. 3 is a schematic diagram of a third example of an electrical supply system; and, FIG. 4 is a schematic diagram of a fourth example of an electrical supply system including a circuit diagram of an example of a voltage converter circuit.

A third example electrical supply system 300 is shown in FIG. 3. Features similar to those of the example described above have been assigned correspondingly similar reference numerals.

In this example, the electrical supply system 300 includes three voltage converters 311, 312, 313 including respective voltage converter inputs 311.1, 312.1, 313.1 electrically coupled to three supplies $S_{3.1}$, $S_{3.2}$, $S_{3.3}$, respectively, and three respective voltage converter outputs 311.2, 312.2, 313.2, three diodes 321, 322, 323 including three respective diode inputs 321.1, 322.1, 323.1 electrically coupled to the voltage converter outputs 311.2, 312.2, 313.2, and a bus 330. The electrical supply system 300 further includes three first voltage sensors 341, 342, 343, a second voltage sensor 350, and three current sensors 361, 362, 363 for detecting respective diode input currents $I_{DI3.1}$, $I_{DI3.2}$, $I_{DI3.3}$. An electronic processing device 370 is coupled to the first voltage, second voltage and current sensors 341, 342, 343, 350, 361, 362, 363 for monitoring the diode input currents $I_{DI3.1}$, $I_{DI3.2}$, $I_{DI3.3}$, output and bus voltages $V_{O3.1}$, $V_{O3.2}$, $V_{O3.3}$, $V_{B3}$ and, detecting one or more faults in the electrical supply system 300. It will therefore be appreciated that these features are largely similar to those described above with respect to FIG. 1, however further specific features will now be described.

In this example, the system includes three DC/DC voltage converters, 311, 312, 313, each of which is coupled to a respective one of three supplies $S_{3.1}$, $S_{3.2}$, $S_{3.3}$, with these being coupled in parallel to the bus 330, allowing power from multiple supplies to be utilised. It will be appreciated from this that any number of supplies and voltage converters may be provided in this arrangement and that the use of three in FIG. 3 is for the purpose of illustration only.

In this example, the supplies $S_{3.1}$, $S_{3.2}$, $S_{3.3}$ include PV cells, and in this regard the supply voltages $V_{S3.1}$, $V_{S3.2}$, $V_{S3.3}$ are typically less than 80 Volts DC. However, it will be appreciated that any DC supply could be used and that as a result, different supply voltages may be used. The voltage converter includes galvanic isolation, and provides output voltages $V_{O3.1}$, $V_{O3.2}$, $V_{O3.3}$ greater than +400 Volts DC. This allows for a bus voltage $V_{B3}$ of greater than +400 Volts DC, which can be beneficial for energy storage, as compared to lower voltage systems. In particular, this allows a high voltage battery B to be coupled to the bus 330, which in use stores power for use at a different time. For example, the battery B may store the power generated during the day while the sun is incident on the PV cells included in the supplies $S_{3.1}$, $S_{3.2}$, $S_{3.3}$ for use at a different time when the sun is no longer incident on the PV cells, such as at night, or during periods of rain or cloud.

In addition, the inverter I allows the DC on the bus 330 to be converted to AC for use in a power network, such as a mains power grid, or household power network, or the like.

Figure 4:
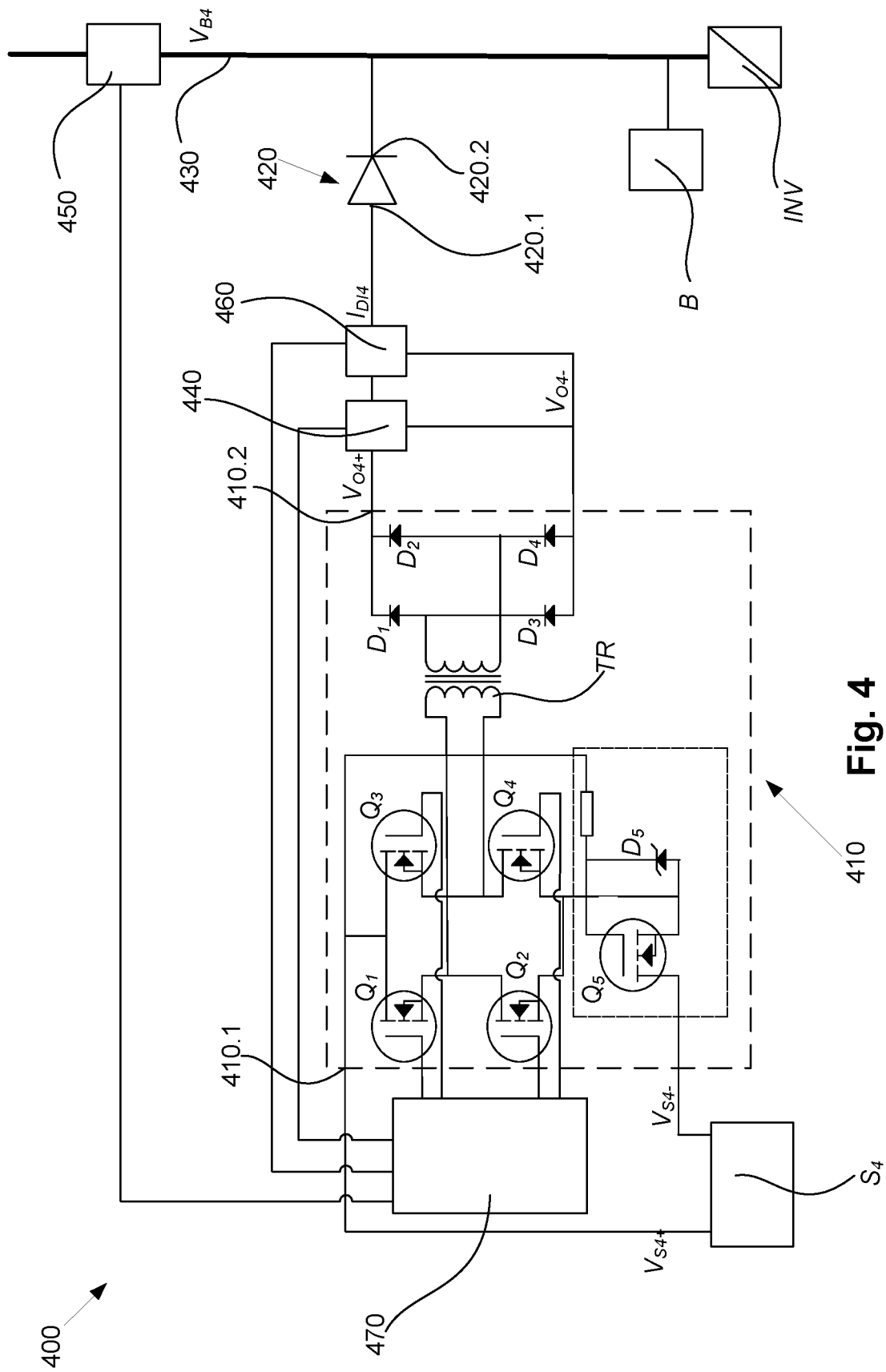

A fourth example electrical supply system 400 is shown in FIG. 4. Features similar to those of the example described above have been assigned correspondingly similar reference numerals.

In this example, the electrical supply system 400 includes a voltage converter 410 including a voltage converter input 410.1 electrically coupled to a supply $S_4$, and a voltage converter output 410.2, a diode 420 including a diode input 420.1 electrically coupled to the voltage converter output 410.2, and a bus 430. The electrical supply system 400 further includes a first voltage sensor 440, a second voltage sensor 450, and a current sensor 460 for detecting a diode input current $I_{DI4}$. An electronic processing device 470 is coupled to the first voltage, optional second voltage and current sensors 440, 450, 460 for monitoring the diode input current $I_{DI2}$, output and bus voltages $V_{O4+/-}$, $V_{B4}$ and, detecting a fault in the electrical supply system. It will therefore be appreciated that these features are largely similar to those described above with respect to FIG. 1, however further specific features will now be described.

In this example, the voltage converter 410 includes a switching circuit formed from a plurality of switches $Q_1$, $Q_2$, $Q_3$, $Q_4$, a transformer TR, and a controller for controlling the switches $Q_1$, $Q_2$, $Q_3$, $Q_4$ to thereby selectively apply the supply signal to a transformer input to thereby generate the output signal at a transformer output.

In one example, the switches $Q_1$, $Q_2$, $Q_3$, $Q_4$ include transistors, and in particular metal oxide semiconductor field effect transistors (MOSFETs), however this is not essential, and any switch or transistor may be used, including junction field effect transistors (JFETs), simple switches, or the like.

The controller causes the switches $Q_1$, $Q_2$, $Q_3$, $Q_4$ to toggle to thereby periodically reverse the polarity of the supply signal applied to the transformer TR input. The frequency at which this is performed can be used to control the output voltage $V_{O4+/-}$. In addition, the voltage converter 410 includes a rectifier $D_1$, $D_2$, $D_3$, $D_4$, for coupling the transformer TR to the voltage converter output 410.2, to thereby generate a DC output signal, as well as to ensure any ripples or anomalies in the signal from the output of the transformer TR are substantially removed, such that the output voltage $V_{O4+/-}$ is rectified. Similarly, by apply either a switched DC signal or no signal to the transformer, this will prevent an output signal being generated, which will in turn isolate the power supply S from the bus 130.

In this example, the controller is the electronic processing device, however it will be appreciated that this is not essential, and instead the controller may be separate firmware implemented using appropriate hardware, and which is coupled to, or included in the electronic processing device 470. In this regard, the electronic processing device 470 is able to control the voltage converter 410, for example in order to isolate the supply $S_4$ in the event of a fault is detected. In addition, the electronic processing device 470 may control the power output of the voltage converter. For example, if the supply $S_4$ includes a PV cell, it may be desirable to control the voltage controller in order to achieve maximum power point tracking (MPPT).

Accordingly, the above described arrangements can be used in arc detection and circuit interruption for the high voltage side of a galvanically isolated DC/DC converter that does not depend upon a mechanical switch to interrupt the circuit. This arrangement utilises a DC/DC converter where the DC power to be transmitted is converted to high frequency alternating current (AC) and then applied to the primary of a transformer including a suitable primary to secondary ratio. The secondary side is then rectified and the power transmitted to the load/s.

The galvanically isolated DC/DC converter is used to detect and isolate DC faults in the high voltage side of the arrangement of FIG. 2, and in particular, the DC/DC converter operational capabilities are used to test the high voltage circuit for DC arc faults, as well as open circuit, short circuit wiring and coupling diode failures.

The system provides a current interruption method using the DC/DC converter in FIG. 4, which includes four MOSFET switches on the input (Q1-Q4) that are protected against reverse polarity connection by a fifth MOSFET Q5 and its associated components. The fifth MOSFET Q5 will only conduct when the gate is enhanced via the resistor and the clamping diode, thereby protecting the input against reverse polarity. The same circuit topology may be used to protect the output against a reverse polarity protection if desired. Thus, the DC/DC converter will not work at all if the input polarity is reversed, and hence the converter can be protected against inadvertent reverse polarity connection on either the input or the output.

The DC converter can provide an ideal circuit breaker, if it is shut down (ie if the four MOSFETs are not switched) no current can flow from the output to the input and as it is inherently uni-directional and the input and output are galvanically isolated.

Detection of faults is performed by selectively controlling the DC converter, and hence the converter output states, and monitoring the effect on current flow in the high voltage side.

To achieve this, controller in the converter periodically reduces (say every 200 ms-1000 ms) the output voltage to less than the DC bus voltage (say-20%) for about 10 ms. This reduction is called the Reduced Voltage Zero power state. If the current goes to near zero then the bus diode is operational and there is no short circuit or shunt arcing fault. However, if the current does not go to zero there is a short circuit or a shunt arcing fault on the DC HV link, in which case the converter is shut down and the DC fault is isolated and a fault indicated on DC/DC converter controller.

To test for a series arc the DC/DC converter power is reduced and the voltage lifted from the Reduced Voltage Zero power state—at a controlled ramp rate back to 5% above the DC bus voltage—if the current does not exactly track this ramp rate it means that there is a series arc. As the converter output voltage attempts to rise above the DC bus c voltage the current should increase unless the voltage is impressed across the series arc. In the event that the current during ramp up does not match the voltage ramp rate it can be safely assumed that there is a series arc present, in which case the converter is shut down and the DC fault isolated and fault indicated on DC/DC converter controller.

In the event that the output current falls to zero with voltage input greater than zero then the converter is shut down and the open circuit fault isolated and fault indicated on DC/DC converter.

FIG. 3 is a single line diagram of a typical system. It should be noted that the DC bus isolation diodes protect against reverse current flow from the DC bus into an arcing or short circuit fault.

It will be appreciated that an electrical supply system 100, 200, 300, 400, and corresponding method 500, with the above described examples, provides for increased safety, and accuracy in fault detection.

Accordingly, the above described systems and processes allow for fault detection and absolute electrical isolation in an electrical supply system.

In one example, the electrical supply system includes a DC bus connected to the output of one or more voltage converters by an output diode, with operation of the system being controlled by a controller.

The DC bus is by definition a voltage source, so that if current flows from the converter to the DC bus, when the converter output voltage is below the DC bus voltage, there must be a shunt path and hence a fault.

To detect a shunt arc fault:
the controller reduces the voltage converter output voltage to a preset voltage (typically at least 2 V) below the DC bus voltage on the other side of the diode;
the controller measures the change of current;
if the current drops to zero there is no shunt arcing fault;
if current continues to flow there is a shunt arc present.

If current flows and a shunt arc fault is detected the converter shuts down. An optional notification of this can be provided. It should be noted that a shunt arc is the most probable and dangerous arc.

On the other hand, if it is possible to raise the converter output voltage above the diode forward voltage plus the DC bus voltage, there must be an increase in the impedance between the converter output and the DC bus, as seen by the converter and again a fault exists.

To detect a series arc fault:
the controller attempts increase the output voltage of the converter to a preset voltage (typically at least 3 V) above the DC bus voltage on the other side of the diode;
the controller measures the change of current and the voltage;
if the voltage rises above the DC bus voltage and diode drop by a threshold amount (say 1.5V) there is high probability of a series arcing fault.

If the converter output voltage rises above the DC bus voltage and diode drop by the threshold amount a series arc fault is detected the converter shuts down. An optional notification of this can be provided.

It will be noted that a shut down on the DC/DC converter can be totally and absolutely guaranteed to interrupt the current under all circumstances as the transformer is an isolated DC/DC converter and as such relies upon the generation of a high frequency waveform to transfer energy from the primary winding to the secondary winding through the coupling magnetic field. If the high frequency waveform generator is shut down, energy transfer must cease. The isolation potential between the two transformer windings is at least 2.5 kV.

Throughout this specification and claims which follow, unless the context requires otherwise, the word "comprise", and variations such as "comprises" or "comprising", will be understood to imply the inclusion of a stated integer or group of integers or steps but not the exclusion of any other integer or group of integers.

Persons skilled in the art will appreciate that numerous variations and modifications will become apparent. All such variations and modifications which become apparent to persons skilled in the art, should be considered to fall within the spirit and scope that the invention broadly appearing before described. Thus, for example, it will be appreciated that features from different examples above may be used interchangeably where appropriate.

The claims defining the invention are as follows:

1. An electrical isolator for isolating a power supply of an electrical supply system, the isolator including a voltage converter having:
   a) a voltage converter input electrically coupled to a supply for receiving a supply signal; and
   b) a voltage converter output for supplying an output signal, the output signal having a output voltage different to a supply voltage of the supply signal;
   c) a transformer;
   d) a switching circuit coupled to the voltage converter input and the transformer; and
   e) a controller configured to:
      i) detect an electrical fault in the electrical supply system; and,
      ii) control the switching circuit to thereby selectively apply the supply signal to a transformer input to thereby at least one of:
         (1) generate the output signal if no fault is detected; and,
         (2) electrically isolate the voltage converter input from the voltage converter output if a fault is detected.

2. The electrical isolator according to claim 1, wherein the switching circuit includes a plurality of switches.

3. The electrical isolator according to claim 2, wherein the switches include transistors.

4. The electrical isolator according to claim 2, wherein the controller causes the switches to toggle to thereby periodically reverse the polarity of the supply signal applied to the transformer input.

5. The electrical isolator according to claim 4, wherein the frequency of switching is used to control the output voltage of the voltage converter.

6. The electrical isolator according to claim 5, wherein the output voltage of the voltage converter is controlled in order to regulate voltage changes in the system caused by one or more of the supply and a load or battery electrically coupled to the supply.

7. The electrical isolator according to claim 6, wherein the supply is a photovoltaic (PV) cell and the output voltage of the voltage converter is controlled in order to achieve maximum power point tracking (MPPT).

8. The electrical isolator according to claim 2, wherein the switches are metal oxide semiconductor field effect transistors.

9. The electrical isolator according to claim 2, wherein the voltage converter includes a rectifier for coupling the transformer to the voltage converter output.

10. The electrical isolator according claim 1, wherein the voltage converter includes galvanic isolation in which functional sections of the voltage converter are electrically isolated.

11. The electrical isolator according to claim 1, wherein the controller at least in part detects a fault in the electrical supply system using a diode input current of a diode electrically coupled to the voltage converter output.

* * * * *